United States Patent
Leipold et al.

(10) Patent No.: US 9,935,210 B2
(45) Date of Patent: Apr. 3, 2018

(54) MICROELECTRONICS PACKAGE WITH INTEGRATED SENSORS

(71) Applicant: Qorvo US, Inc., Greensboro, NC (US)

(72) Inventors: Dirk Robert Walter Leipold, San Jose, CA (US); George Maxim, Saratoga, CA (US); Julio C. Costa, Oak Ridge, NC (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/408,560

(22) Filed: Jan. 18, 2017

(65) Prior Publication Data
US 2017/0207350 A1 Jul. 20, 2017

Related U.S. Application Data

(60) Provisional application No. 62/280,186, filed on Jan. 19, 2016.

(51) Int. Cl.
*H01L 31/0232* (2014.01)
*H01L 31/0203* (2014.01)
(Continued)

(52) U.S. Cl.
CPC ...... *H01L 31/0203* (2013.01); *H01L 27/1446* (2013.01); *H01L 31/02005* (2013.01);
(Continued)

(58) Field of Classification Search
CPC .................................................. H01L 31/0201
See application file for complete search history.

(56) References Cited

U.S. PATENT DOCUMENTS 4,093,562 A 6/1978 Kishimoto
4,366,202 A 12/1982 Borovsky
(Continued)

FOREIGN PATENT DOCUMENTS

CN 103811474 A 5/2014
EP 2996143 A1 3/2016
(Continued)

OTHER PUBLICATIONS

Non-Final Office Action for U.S. Appl. No. 15/293,947, dated Apr. 7, 2017, 12 pages.
(Continued)

*Primary Examiner* — Chandra Chaudhari
(74) *Attorney, Agent, or Firm* — Withrow & Terranova, P.L.L.C.

(57) ABSTRACT

The present disclosure relates to a microelectronics package with optical sensors and/or thermal sensors. The disclosed microelectronics package includes a module substrate, a thinned flip-chip die with an upper surface that includes a first surface portion and a second surface portion surrounding the first surface portion, and a first mold compound component. The thinned flip-chip die is attached to the module substrate and includes a device layer with sensor structure integrated at a top portion of the device layer. Herein, the sensor structure is below the first surface portion and not below the second surface portion. The first mold compound component is formed over the second surface portion to define a first cavity over the upper surface of the thinned flip-chip die. The first mold compound component is not over the first surface portion, and the first surface portion is exposed at the bottom of the first cavity.

31 Claims, 8 Drawing Sheets

(51) Int. Cl.
　　　*H01L 31/105*　　　(2006.01)
　　　*H01L 37/02*　　　(2006.01)
　　　*H01L 35/32*　　　(2006.01)
　　　*H01L 31/02*　　　(2006.01)
　　　*H01L 27/144*　　(2006.01)

(52) U.S. Cl.
　　　CPC ...... *H01L 31/02327* (2013.01); *H01L 31/105* (2013.01); *H01L 35/32* (2013.01); *H01L 37/02* (2013.01)

(56) References Cited

U.S. PATENT DOCUMENTS

| | | |
|---|---|---|
| 5,061,663 A | 10/1991 | Bolt et al. |
| 5,069,626 A | 12/1991 | Patterson et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,831,369 A | 11/1998 | Fürbacher et al. |
| 5,920,142 A | 7/1999 | Onishi et al. |
| 6,072,557 A | 6/2000 | Kishimoto |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,426,559 B1 | 7/2002 | Bryan et al. |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,864,156 B1 | 3/2005 | Conn |
| 6,943,429 B1 | 9/2005 | Glenn et al. |
| 6,992,400 B2 | 1/2006 | Tlkka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,288,435 B2 | 10/2007 | Aigner et al. |
| 7,307,003 B2 | 12/2007 | Reif et al. |
| 7,393,770 B2 | 7/2008 | Wood et al. |
| 7,427,824 B2 | 9/2008 | Iwamoto et al. |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,790,543 B2 | 9/2010 | Abadeer et al. |
| 7,855,101 B2 | 12/2010 | Furman et al. |
| 7,868,419 B1 | 1/2011 | Kerr et al. |
| 7,960,218 B2 | 6/2011 | Ma et al. |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,664,044 B2 | 3/2014 | Jin et al. |
| 8,772,853 B2 | 7/2014 | Hong et al. |
| 8,791,532 B2 * | 7/2014 | Graf .................. H01L 24/32 257/414 |
| 8,802,495 B2 | 8/2014 | Kim et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,963,321 B2 | 2/2015 | Lenniger et al. |
| 9,165,793 B1 | 10/2015 | Wang et al. |
| 9,368,429 B2 * | 6/2016 | Ma .................... H01L 23/481 |
| 9,461,001 B1 | 10/2016 | Tsai et al. |
| 2001/0004131 A1 | 6/2001 | Masayuki et al. |
| 2002/0185675 A1 | 12/2002 | Furukawa |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0079686 A1 | 4/2005 | Aigner et al. |
| 2005/0212419 A1 | 9/2005 | Vazan et al. |
| 2006/0108585 A1 | 5/2006 | Gan et al. |
| 2006/0261446 A1 | 11/2006 | Wood et al. |
| 2007/0020807 A1 | 1/2007 | Geefay et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0190747 A1 | 8/2007 | Humpston et al. |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0164528 A1 | 7/2008 | Cohen et al. |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0173436 A1 | 7/2010 | Ouellet et al. |
| 2010/0200919 A1 | 8/2010 | Kikuchi |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2012/0003813 A1 | 1/2012 | Chuang et al. |
| 2012/0068276 A1 | 3/2012 | Lin et al. |
| 2012/0094418 A1 | 4/2012 | Grama et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2015/0115416 A1 | 4/2015 | Costa et al. |
| 2015/0130045 A1 | 5/2015 | Tseng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380523 A1 | 12/2015 | Hekmatshoartabari et al. |
| 2016/0002510 A1 | 1/2016 | Champagne et al. |

(56) References Cited

U.S. PATENT DOCUMENTS

| | | | |
|---|---|---|---|
| 2016/0079137 A1 | 3/2016 | Leipold et al. | |
| 2016/0093580 A1 | 3/2016 | Scanlan et al. | |
| 2016/0155706 A1 | 6/2016 | Yoneyama et al. | |
| 2016/0284568 A1 | 9/2016 | Morris et al. | |

FOREIGN PATENT DOCUMENTS

| | | | |
|---|---|---|---|
| JP | 2006005025 A | 1/2006 | |
| JP | 2007227439 A | 9/2007 | |
| JP | 2008235490 A | 10/2008 | |
| JP | 2008279567 A | 11/2008 | |
| JP | 2009026880 A | 2/2009 | |
| JP | 2009530823 A | 8/2009 | |
| WO | 2007074651 A1 | 7/2007 | |

OTHER PUBLICATIONS

Notice of Allowance for U.S. Appl. No. 14/851,652, dated Apr. 11, 2017, 9 pages.
Final Office Action for U.S. Appl. No. 15/173,037, dated May 2, 2017, 13 pages.
Non-Final Office Action for U.S. Appl. No. 15/353,346, dated May 23, 2017, 15 pages.
Non-Final Office Action for U.S. Appl. No. 15/085,185, dated Jun. 6, 2017, 5 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Non-Final Office Action for U.S. Appl. No. 14/715,830, dated Apr. 13, 2016, 16 pages.
Extended European Search Report for European Patent Application No. 15184861.1, dated Jan. 25, 2016, 6 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, dated Feb. 22, 2013, 58 pages.
Office Action for Japanese Patent Application No. 2011-229152, dated May 10, 2013, 7 pages.
Final Rejection for Japanese Patent Application No. 2011-229152, dated Oct. 25, 2013, 2 pages.
Final Office Action for U.S. Appl. No. 13/852,648, dated Jul. 20, 2016, 14 pages.
Notice of Allowance for U.S. Appl. No. 14/529,870, dated Jul. 15, 2016, 8 pages.
Office Action of the Intellectual Property Office for Taiwanese Patent Application No. 104130224, dated Jun. 15, 2016, 9 pages.
Author Unknown, "Fully Sintered Ferrite Powders," Powder Processing and Technology, LLC, Date Unknown, 1 page.
Author Unknown, "Hysol UF3808," Henkel Corporation, Technical Data Sheet, May 2013, 2 pages.
Final Office Action for U.S. Appl. No. 14/715,830, dated Sep. 6, 2016, 13 pages.
Non-Final Office Action for U.S. Appl. No. 14/851,652, dated Oct. 7, 2016, 10 pages.
Notice of Allowance for U.S. Appl. No. 14/959,129, dated Oct. 11, 2016, 8 pages.
International Search Report and Written Opinion for PCT/US2016/045809, dated Oct. 7, 2016, 11 pages.
Advisory Action for U.S. Appl. No. 14/715,830, dated Oct. 31, 2016, 6 pages.
Non-Final Office Action for U.S. Appl. No. 15/173,037, dated Jan. 10, 2017, 8 page.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,243, dated Aug. 31, 2016, 8 pages.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 15/085,185, dated Feb. 15, 2017, 10 pages.
Notice of Allowance for U.S. Appl. No. Patent Application No. 15/293,947, dated Aug. 14, 2017, 7 pages.
Corrected Notice of Allowance for U.S. Appl. No. 14/851,652, dated Jul. 24, 2017, 6 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Notice of Allowance for U.S. Appl. No. 14/885,202, dated Jul. 24, 2017, 8 pages.

(56) References Cited

OTHER PUBLICATIONS

Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Heat Transfer," Cool Polymers, Inc., 2006, http://www.coolpolymers.com/heattrans.html, 2 pages.
Author Unknown, "Plastics that Conduct Heat," Plastics Technology Online, Jun. 2001, Retrieved Jun. 24, 2013, http://www.ptonline.com/articles/plastics-that-conduct-heat, 4 pages.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.

Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased - Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon - wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré C. et al., "Advanced SOI Substrate Manufacturing," 2004 IEEE International Conference on Integrated Circuit Design and Technology, 2004, IEEE, pp. 105-111.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.

(56) References Cited

OTHER PUBLICATIONS

Raskin, Jean-Pierre et al., "Substrate Crosstalk Reduction Using SOI Technology," IEEE Transactions on Electron Devices, vol. 44, No. 12, Dec. 1997, pp. 2252-2261.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Rong, B., et al., "Surface-Passivated High-Resistivity Silicon Substrates for RFICs," IEEE Electron Device Letters, vol. 25, No. 4, Apr. 2004, pp. 176-178.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Corrected Notice of Allowance for U.S. Appl. No. 14/851,652, dated Sep. 6, 2017, 5 pages.
Notice of Allowance for U.S. Appl. No. 15/229,780, dated Oct. 3, 2017, 7 pages.
Notice of Allowance for U.S. Appl. No. 15/287,202, dated Aug. 25, 2017, 11 pages.
Notice of Allowance for U.S. Appl. No. 15/353,346, dated Sep. 25, 2017, 9 pages.
Supplemental Notice of Allowability for U.S. Appl. No. 15/287,273, dated Sep. 7, 2017, 5 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.

Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Non-Final Office Action for U.S. Appl. No. 15/652,826, dated Nov. 3, 2017, 5 pages.
Notice of Allowance for U.S. Appl. No. 15/648,082, dated Nov. 29, 2017, 8 pages.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Final Office Action for U.S. Appl. No. 15/262,457, dated Dec. 19, 2017, 12 pages.
Supplemental Notice of Allowability for U.S. Appl. No. 15/287,273, dated Jan. 17, 2018, 5 pages.
Non-Final Office Action for U.S. Appl. No. 15/491,064, dated Jan. 2, 2018, 9 pages.
Non-Final Office Action for U.S. Appl. No. 15/387,855, dated Jan. 16, 2018, 7 pages.

\* cited by examiner

MICROELECTRONICS PACKAGE WITH INTEGRATED SENSORS

RELATED APPLICATIONS

This application claims the benefit of provisional patent application Ser. No. 62/280,186, filed Jan. 19, 2016, the disclosure of which is hereby incorporated herein by reference in its entirety.

FIELD OF THE DISCLOSURE

The present disclosure relates to a microelectronics package and more particularly to a microelectronics package with optical sensors and/or thermal sensors.

BACKGROUND

Flip-chip assembly technology is widely utilized in semiconductor packaging due to its preferable interconnects between flip-chip dies and laminate, which eliminates the space needed for wire bonding and die surface area of a package and essentially reduces the overall size of the package. In addition, the elimination of wire connections and implementation of shorter electrical paths from the flip-chip dies to the laminate reduce undesired inductance and capacitance.

In recent decades, silicon on insulator (SOI) substrates have been widely used in forming flip-chip dies due to the low cost of silicon materials, large scale capacity of wafer production, well-established semiconductor design tools, and well-established semiconductor manufacturing techniques. However, a thick silicon handle layer in the SOI substrates severely limits the SOI's usage in optical/thermal detecting applications. By using SOI substrates in optical/thermal applications, the thick silicon handle layer will attenuate or obstruct light/thermal signals passing towards optical/thermal sensors, which are integrated in a device layer underlying the thick silicon handle layer. Such attenuation or obstruction of the light/thermal signals causes a slow response and low efficiency of the optical/thermal sensors.

Accordingly, there remains a need for improved microelectronics package designs that improve the response speed and efficiency of the optical/thermal sensors and utilize the advantages of flip-chip assembly. In addition, there is also a need to enhance the performance of the microelectronics package without increasing the package size.

SUMMARY

The present disclosure relates to a microelectronics package with optical sensors and/or thermal sensors. The disclosed microelectronics package includes a module substrate, a thinned flip-chip die with an upper surface that includes a first surface portion and a second surface portion surrounding the first surface portion, and a first mold compound component. The thinned flip-chip die includes a device layer with a sensor structure integrated at a top portion of the device layer, a dielectric layer over an upper surface of the device layer, and a number of interconnects extending from a lower surface of the device layer and coupled to the module substrate. Herein, the sensor structure is below the first surface portion and not below the second surface portion. The first mold compound component is formed over the second surface portion to define a first cavity over the upper surface of the thinned flip-chip die. The first mold compound component is not over the first surface portion, and the first surface portion is exposed at the bottom of the first cavity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
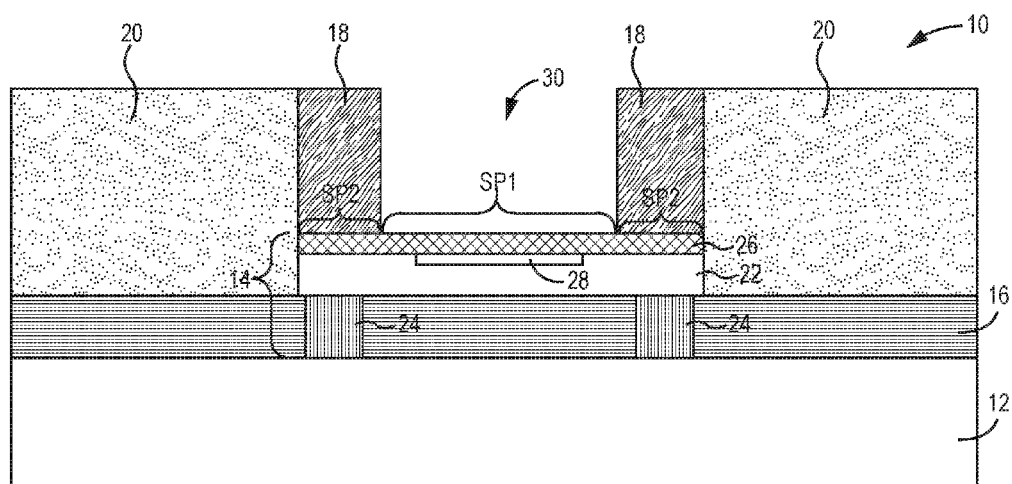
FIGS. 1A-1B show an exemplary microelectronics package with an integrated sensor structure according to one embodiment of the present disclosure.

It will be understood that for clear illustrations, FIGS. 1A-5 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
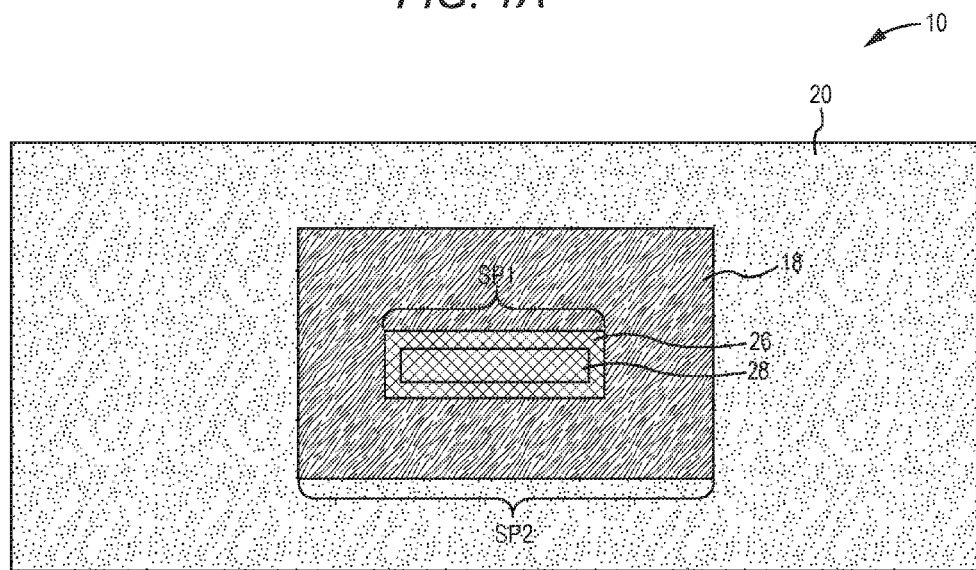

The present disclosure relates to a microelectronics package with optical sensors and/or thermal sensors. FIGS. 1A and 1B provide an exemplary microelectronics package 10 according to one embodiment of the present disclosure. FIG. 1A shows a cross-sectional view of the exemplary microelectronics package 10, and FIG. 1B shows a top view of the exemplary microelectronics package 10. For the purpose of this illustration, the microelectronics package 10 includes a module substrate 12, a thinned flip-chip die 14, an underfilling layer 16, a first mold compound component 18, and a second mold compound component 20. In different applications, the microelectronics package 10 may include multiple thinned flip-chip dies 14.

In detail, the module substrate 12 may be formed from a laminate, a wafer level fan out (WLFO) carrier, a lead frame, a ceramic carrier, or the like. The thinned flip-chip die 14 includes a device layer 22, a number of interconnects 24 extending from a lower surface of the device layer 22 and coupled to an upper surface of the module substrate 12, a dielectric layer 26 over an upper surface of the device layer 22, and essentially no silicon handle layer (not shown) over the dielectric layer 26. Herein, essentially no silicon handle layer over the dielectric layer 26 refers to at most 2 μm silicon handle layer over the dielectric layer 26. The thinned flip-chip die 14 has an upper surface including a first surface portion SP1 and a second surface portion SP2 surrounding the first surface portion SP1. In some applications, the upper surface of the thinned flip-chip die 14 is an upper surface of the dielectric layer 26. For other cases, the upper surface of the thinned flip-chip die 14 is an upper surface of the thin silicon handle layer (not shown). The device layer 22 may be formed of silicon oxide or the like, and the dielectric layer 26 may be formed of silicon oxide or the like, which may serve as an etch stop in a process to remove the silicon handle layer (further details may be found in U.S. patent application Ser. No. 15/287,202, which is incorporated herein by reference). Within the device layer 22, a sensor structure 28 is integrated at a top portion of the device layer 22. The sensor structure 28 is below the first surface portion SP1 of the thinned flip-chip die 14 and not below the second surface portion SP2 of the thinned flip-chip die 14.

The underfilling layer 16 resides over the upper surface of the module substrate 12, such that the underfilling layer 16 encapsulates the interconnects 24 and underfills the thinned flip chip die 14 between the lower surface of the device layer 22 and the upper surface of the module substrate 12. The underfilling layer 16 may be formed from conventional polymeric compounds, which serve to mitigate the stress effects caused by Coefficient of Thermal Expansion (CTE) mismatch between the thinned flip chip die 14 and the substrate 12.

The first mold compound component 18 is formed over the second surface portion SP2 of the thinned flip-chip die 14 to define a cavity 30 over the upper surface of the thinned flip-chip die 14. Herein, the first mold compound component 18 is not over the first surface portion SP1 of the thinned flip-chip die 14, and the first surface portion SP1 of the thinned flip-chip die 14 is exposed at the bottom of the cavity 30. Because there is no mold compound component or silicon handle layer over the first surface portion SP1 of the thinned flip-chip die 14 and because the dielectric layer 26 is rather thin, between 10 nm and 2 μm, the dielectric layer 26 is transparent and the sensor structure 28 below the first surface portion SP1 of the thinned flip-chip die 14 will detect light/thermal signals through the cavity 30 with a superior efficiency.

The first mold compound component 18 may be a high thermal conductivity mold compound component and may be formed from a thermoset or thermoplastic material. Compared to a normal mold compound component having 0.8 w/m·k thermal conductivity, the high thermal conductivity mold compound component may have 2.5 w/m·k~50 w/m·k or greater thermal conductivity, such as Hitachi Chemical Electronic Materials GE-506HT. The higher the thermal conductivity, the better the heat dissipation performance of the microelectronics package 10.

The second mold compound component 20 resides over the underfilling layer 16, and encapsulates at least the sides of the first mold compound component 18, the sides of the device layer 22, and the sides of the dielectric layer 26. Herein, the second mold compound component 20 may be formed from a same or different material as the underfilling layer 16. When the second mold compound component 20 and the underfilling layer 16 are formed from a same material, the second mold compound component 20 and the underfilling layer 16 may be formed at a same step. In addition, the second mold compound component 20 may be formed from a same or different material as the first mold compound component 18. However, unlike the first mold compound component 18, the second mold compound component 20 does not have a thermal conductivity requirement in higher performing embodiments. One exemplary material used to form the second mold compound component 20 is an organic epoxy resin system.

Figure 2A:
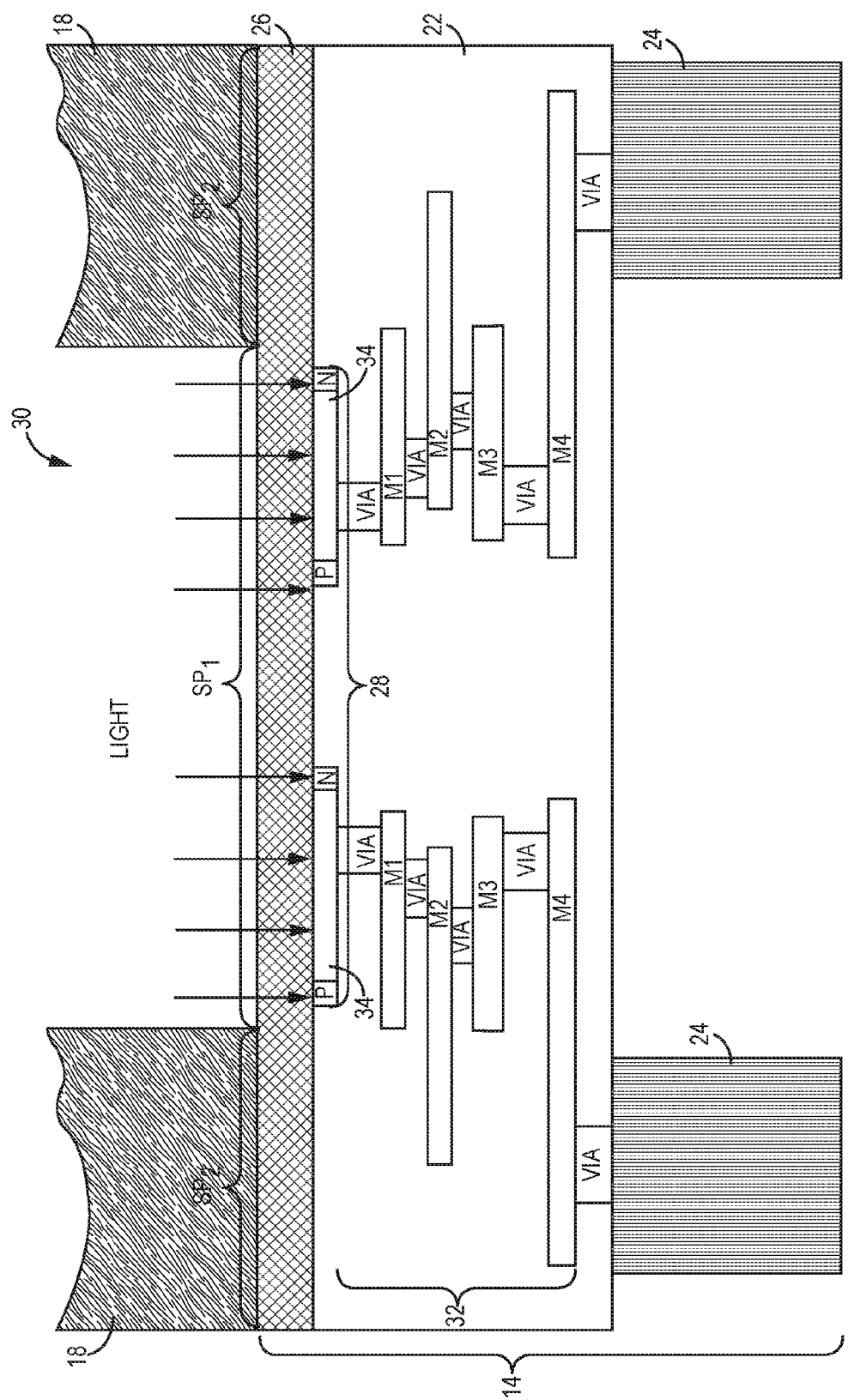
FIGS. 2A-2D show an exemplary thinned flip-chip die within the exemplary microelectronics package shown in FIG. 1A.

FIGS. 2A-2D illustrate details of the thinned flip-chip die 14 within the microelectronics package 10 shown in FIG. 1A. As illustrated in FIG. 2A, the device layer 22 also includes a multi-layer metal structure 32 below the sensor structure 28, which may be utilized to connect the sensor structure 28 to the interconnects 24. The multi-layer metal structure 32 includes four metal layers (M1, M2, M3, and M4) and ten vias (VIA). In different applications, the multi-layer metal structure 32 may include fewer or more metal layers/vias and each metal layer/via may have a different size. In this embodiment, the sensor structure 28 includes multiple optical sensors 34 directly below the dielectric layer 26 to detect light signals. Since the multi-layer metal structure 32 is below the optical sensors 34, each optical sensor 34 will be efficiently illuminated from the first surface portion SP1 of the thinned flip-chip die 14 without having an impact from the multi-layer metal structure 32. Each optical sensor 34 may be formed from a lateral PIN diode, which has a low-doped insulating region laterally formed between a p-type region and an n-type region. The low-doped insulating region used for light detection will result in a fast response of the optical sensors 34. Each optical sensor 34 may laterally reside in a same plane directly below the dielectric layer 26 and may be separated from one another.

Figure 2B:
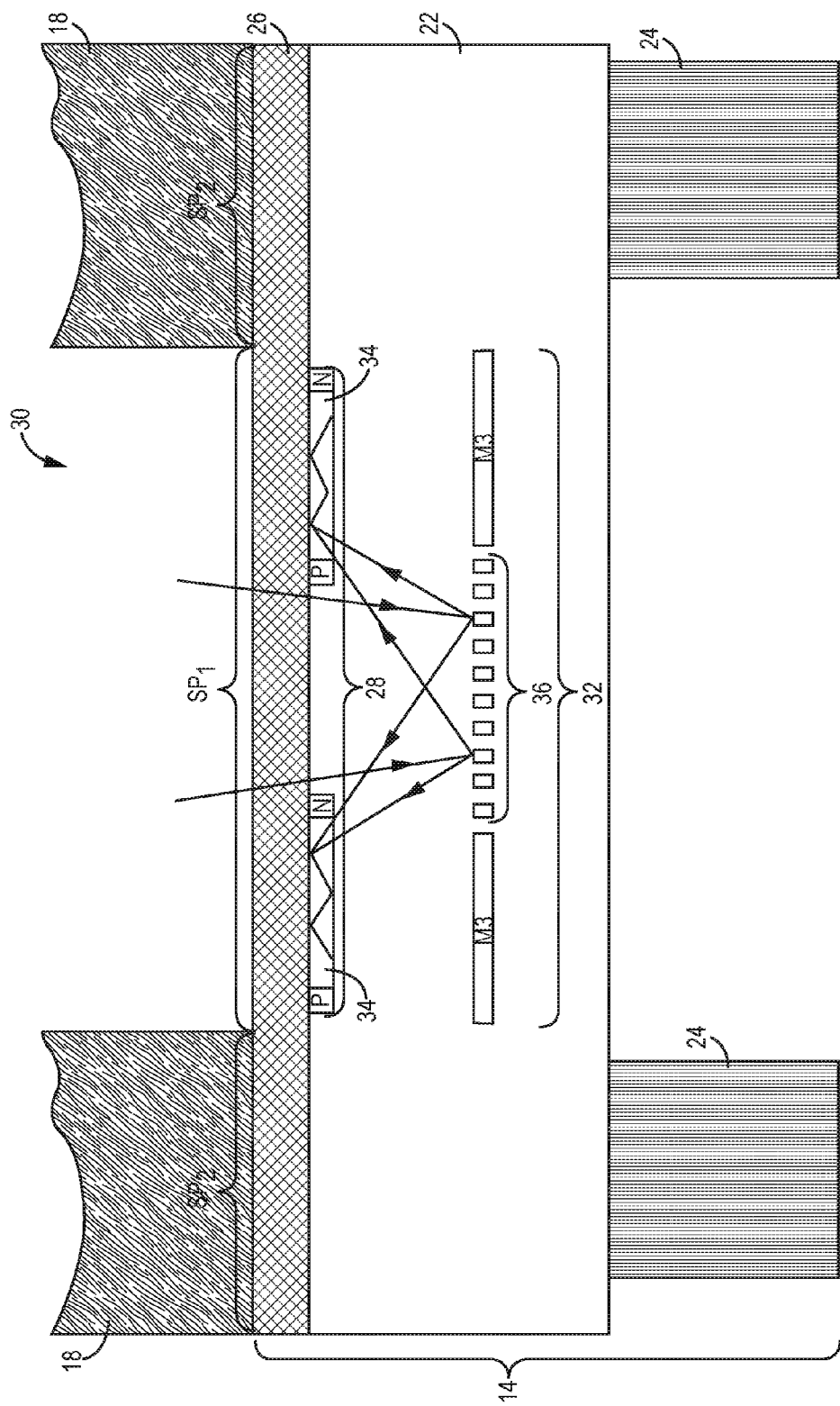

In order to improve the efficiency of capturing light by the optical sensors 34, the multi-layer metal structure 32 may further include an integrated metal grating 36 below the sensor structure 28 to reflect received light passing through the dielectric layer 26 back toward the optical sensors 34 as shown in FIG. 2B. In this embodiment, the integrated metal grating 36 may be formed from the metal layer M3. For simplification and clear illustration, only the metal layer M3 of the multi-layer metal structure 32 is shown in FIG. 2B. Herein, the integrated metal grating 36 is on a first plane and the optical sensors 34 are on a second plane, which is above and separated from the first plane by at least 200 nm. The integrated metal grating 36 may be formed in a stripe pattern or an array pattern.

Figure 2C:
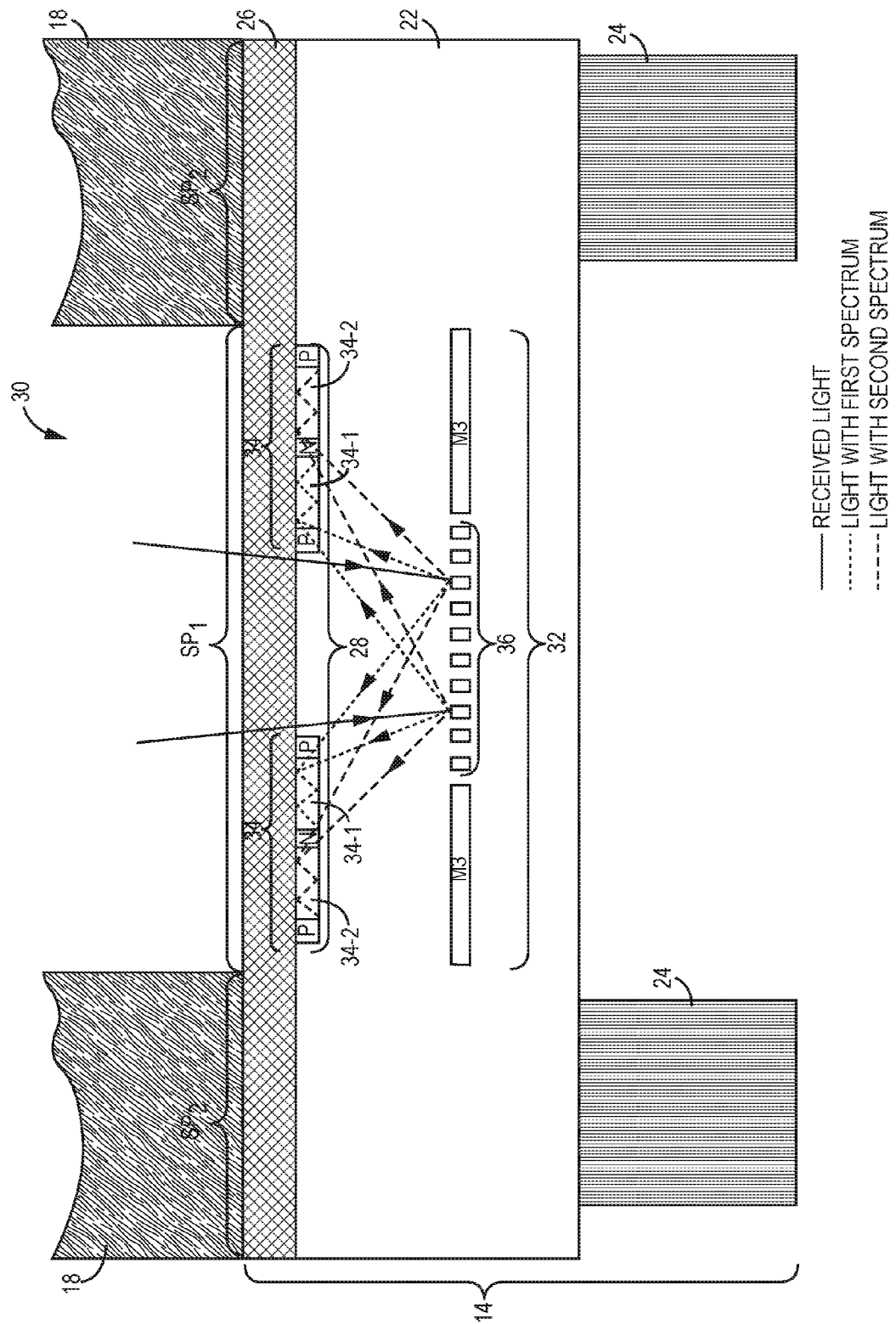

With the integrated metal grating 36, the sensor structure 28 may be configured to detect the received light in different spectrums. As shown in FIG. 2C, each optical sensor 34 includes a first senor portion 34-1 and a second sensor portion 34-2, which may be laterally and directly adjacent to the first sensor portion 34-1. The first sensor portion 34-1 and the second sensor portion 34-2 may be formed from lateral PIN diodes. Because light in different spectrums has different reflectivity, the integrated metal grating 36 may be configured to separate and reflect the received light passing through the dielectric layer 26 back toward the first sensor portion 34-1 and the second sensor portion 34-2. In this embodiment, light in a first spectrum of the received light is predominantly directed toward the first sensor portion 34-1 and light in a second spectrum of the received light is predominantly directed toward the second sensor portion 34-2. As such, the integrated metal grating may be configured to separate and reflect different colors (light in different spectrums has different colors) for the first sensor portion 34-1 and the second sensor portion 34-2.

Figure 2D:
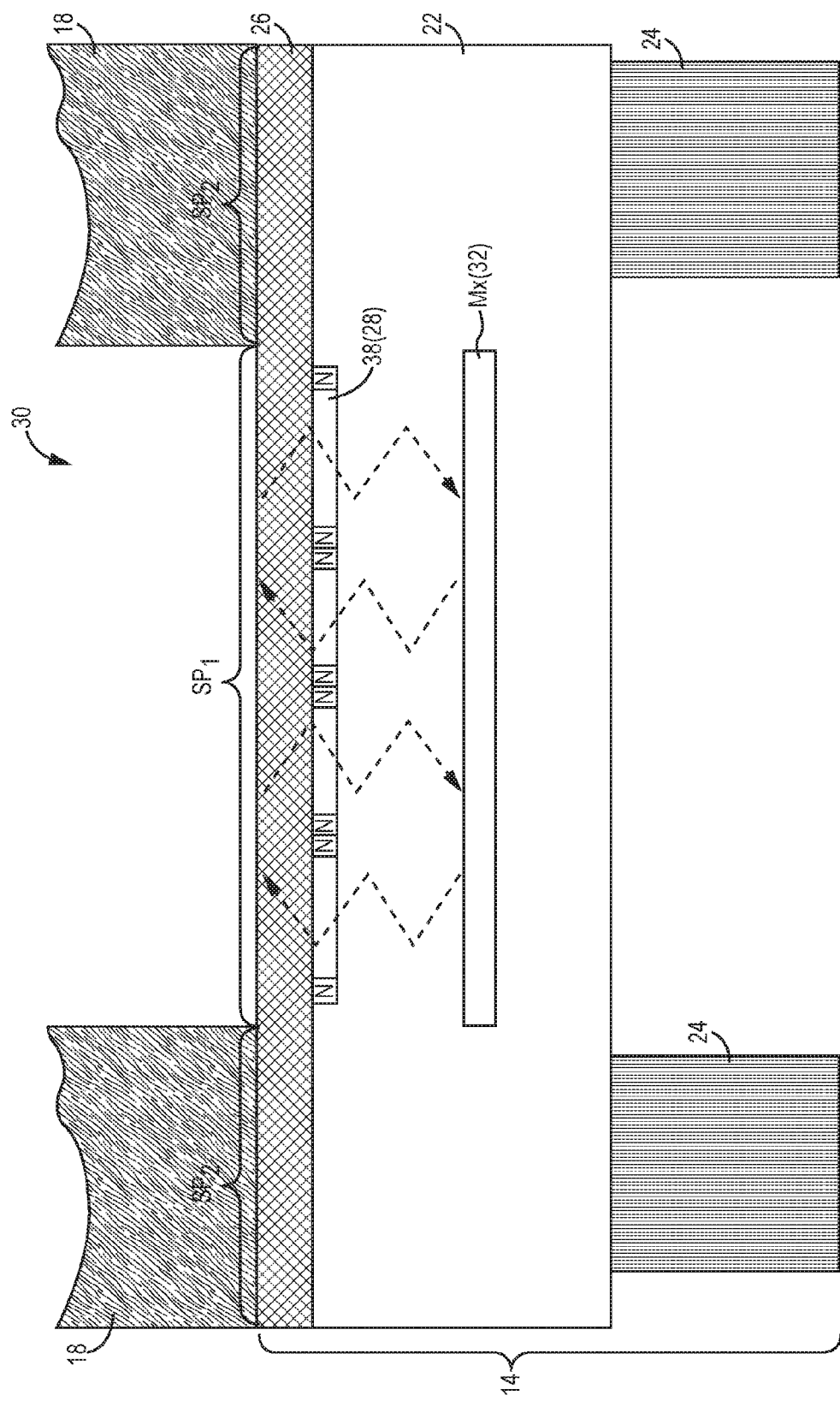

It will be clear to those skilled in the art that it is also possible that the sensor structure 28 includes a thermal sensor 38, such as a thermistor or a bolometer, as shown in FIG. 2D. The thermal sensor 38 may be formed from multiple end-to-end lateral semiconductor resistors (ie: n-doped region|insulating region|n-doped region strings), or multiple end-to-end lateral PIN diodes (not shown). The multi-layer metal structure 32 may include a thermal metal layer Mx, which is used to reflect thermal signals back towards the thermal sensor 38. A differential temperature detection may be realized by changing the thermal conductivity of the thermal sensor 38 and/or the thermal conductivity of the thermal metal layer Mx. In addition, the differential temperature detection may be realized by detecting the electrothermal voltage created when two different metal interfaces of adjacent semiconductor resistors/PIN diodes (in the thermal sensor 38) touch each other. For simplification and clear illustration, only the thermal metal layer Mx of the multi-layer metal structure 32 is shown in FIG. 2D.

Figure 3:
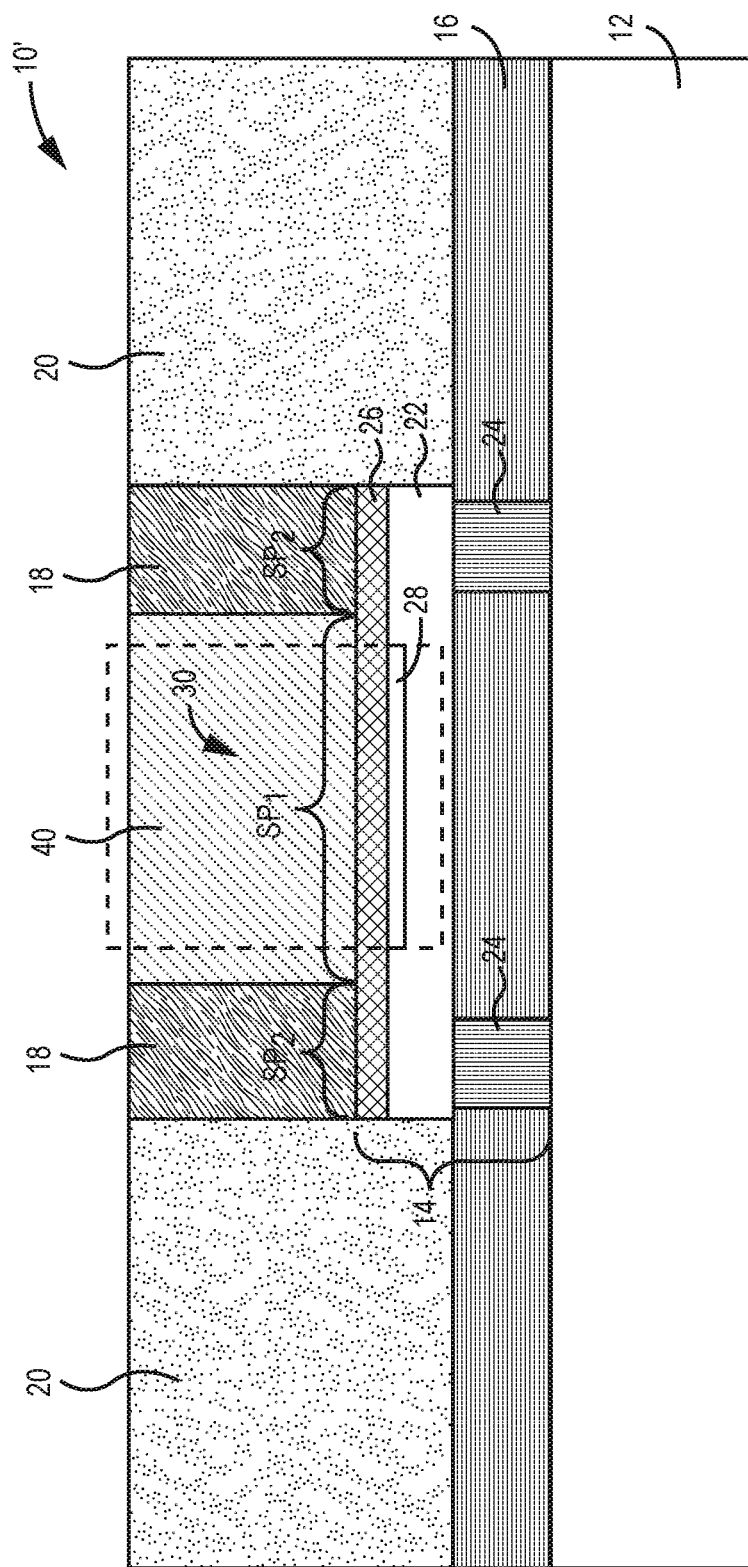
FIG. 3 shows an exemplary microelectronics package with an integrated sensor structure according to one embodiment of the present disclosure.

In some applications, a transparent material may be applied in the cavity 30 and may reside over the first surface portion SP1. FIG. 3 provides an exemplary microelectronics package 10' with a transparent material 40. The transparent material 40 resides over the first surface portion SP1 and within the cavity 30, and is surrounded by the first mold compound component 18. Herein, the transparent material 40 may be configured to filter at least a portion of ambient light that passes through the transparent material 40, configured to direct or focus at least a portion of the ambient light that passes through the transparent material 40 toward a specific area of the first surface portion SP1 of the thinned flip-chip die 14, or configured to function as a protecting lens for the sensor structure 28. The transparent material 40 may be formed from polymide.

Figure 4:
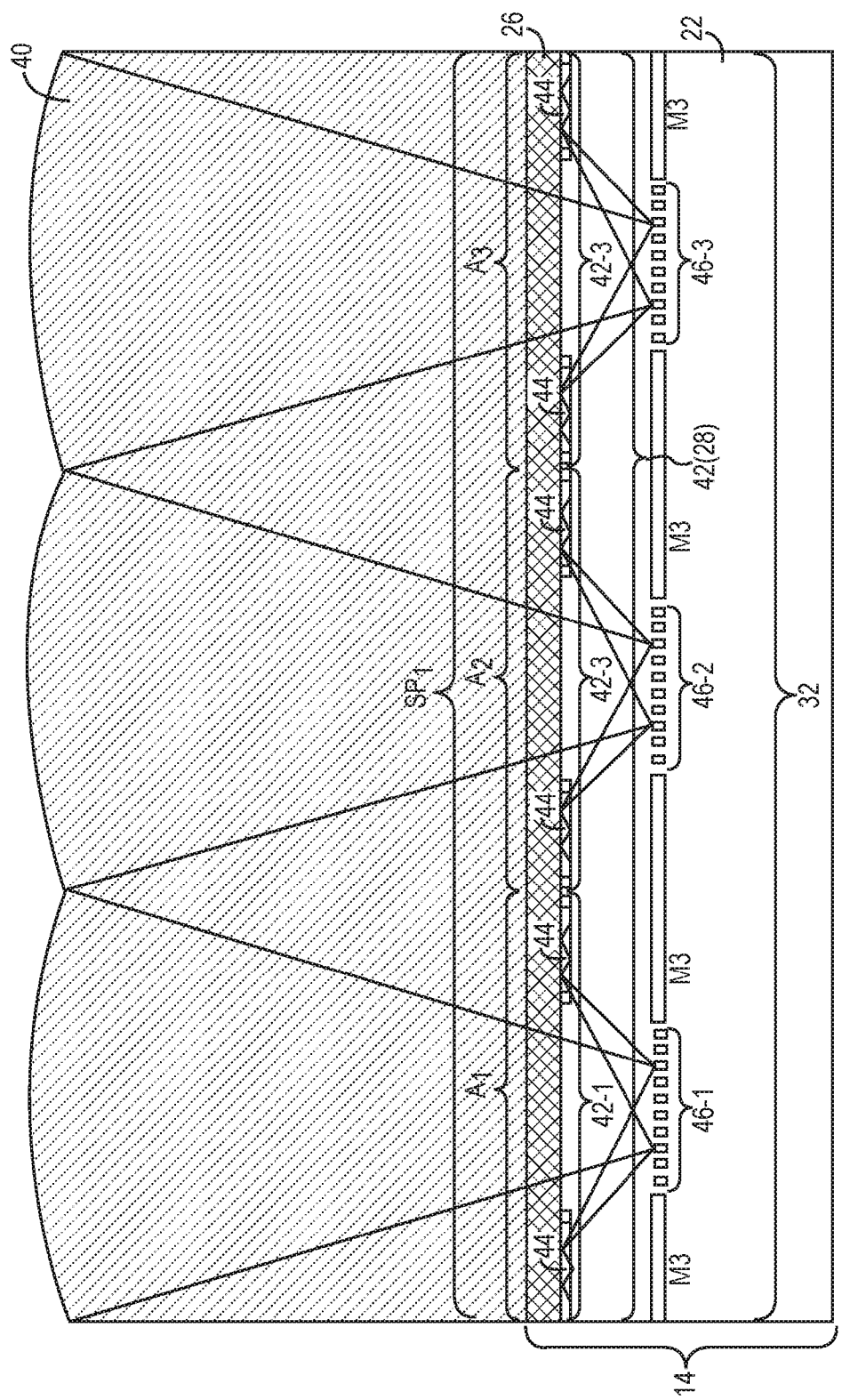
FIG. 4 shows an exemplary thinned flip-chip die within the exemplary microelectronics package shown in FIG. 3.

FIG. 4 provides details of the thinned flip-chip die 14 within the microelectronics package 10' shown in FIG. 3. For simplification and clear illustration, only a portion of the thinned flip-chip die 14 within the dashed section of FIG. 3 is illustrated. In this embodiment, the sensor structure 28 includes an optical sensor array 42 directly below the dielectric layer 26 to detect light signals. For the purpose of this illustration, the optical sensor array 42 includes a first array portion 42-1, a second array portion 42-2, and a third array portion 42-3. Each array portion includes multiple optical sensors 44. In different applications, the optical sensor array 42 may include fewer or more array portions directly below the dielectric layer 26; and the first array portion 42-1, the second array portion 42-2, and the third array portion 42-3 may include a same or different number of optical sensors 44. The first array portion 42-1 is below a first area A1 of the first surface portion SP1, the second array portion 42-2 is below a second area A2 of the first surface portion SP1, and the third array portion 42-3 is below a third area A3 of the first surface portion SP1.

In this embodiment, the multi-layer metal structure 32 may further include a first integrated metal grating 46-1, a second integrated metal grating 46-2, and a third integrated metal grating 46-3 below the first array portion 42-1, the second array portion 42-2, and the third array portion 42-3, respectively. The first integrated metal grating 46-1, the second integrated metal grating 46-2, and the third integrated metal grating 46-3 are formed from the metal layer M3. For simplification and clear illustration, only the metal layer M3 of the multi-layer metal structure 32 is shown in FIG. 4.

Herein, the transparent material 40 may have different utilizations for the optical sensor array 42. The transparent material 40 may be configured to filter at least a portion of the ambient light that passes through the transparent material 40. Alternatively, a first portion of the transparent material 40, which is above the first area A1 of the first surface portion SP1, may direct or focus a first portion of the ambient light that passes through the transparent material 40 toward the first area A1 of the first surface portion SP1. As such, the first portion of the ambient light will be reflected by the first integrated metal grating 46-1 and back toward the first array portion 42-1. Similarly, a second portion and a third portion of the ambient light will be reflected by the second integrated metal grating 46-2 and the third integrated metal grating 46-3, and back toward the second array portion 42-2 and the third array portion 42-3, respectively. Consequently, the ambient light that passes through the transparent material 40 may be separated and detected by different array portions. The transparent material 40 may have an upper surface with a shape according to a Fresnel lens and/or standard lens profile. The transparent material 40 may also use diffractive patterns to generate needed optical functions, i.e. focusing and/or wave length selection of the ambient light.

Figure 5:
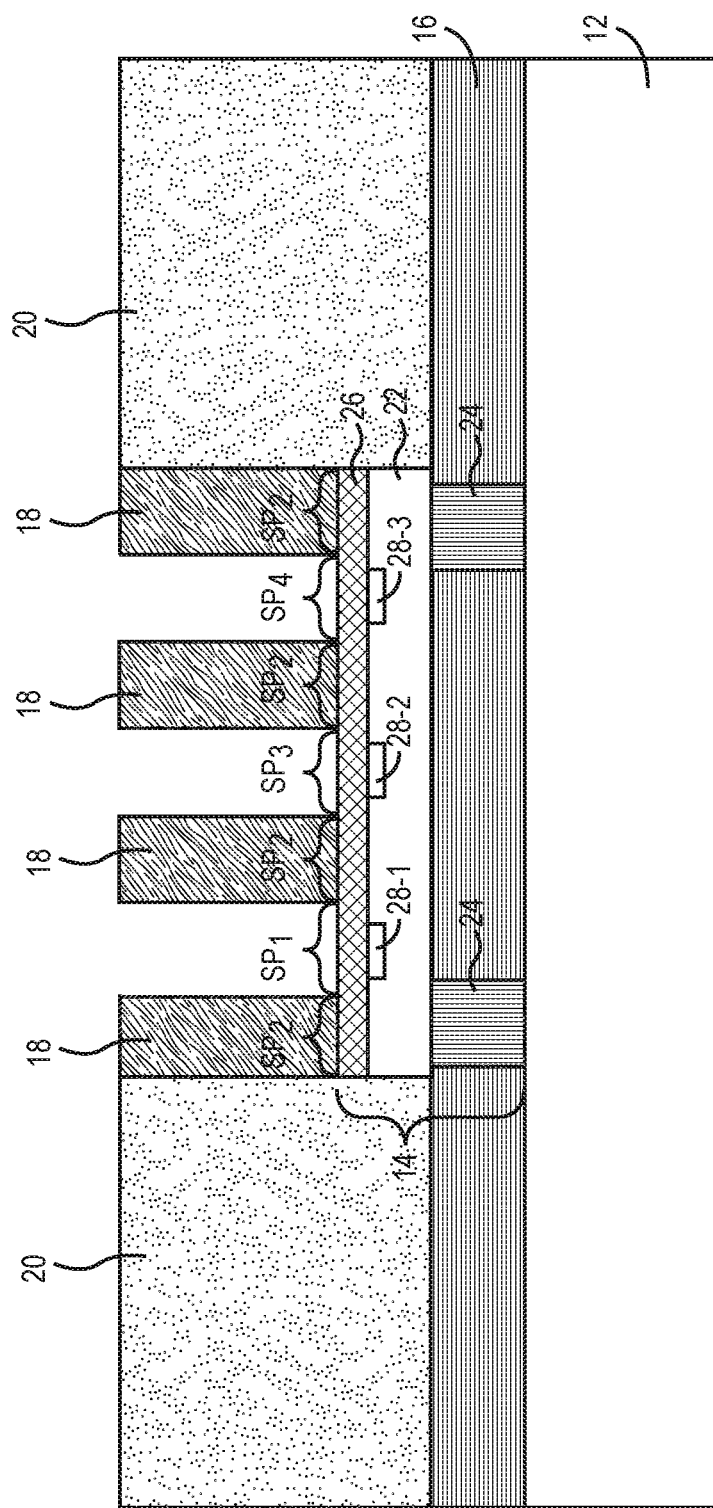
FIG. 5 shows an exemplary microelectronics package with multiple integrated sensor structures according to one embodiment of the present disclosure.

In another embodiment, the device layer 22 may include multiple sensor structures. For the purpose of this illustration, three sensor structures, a first sensor structure 28-1, a second sensor structure 28-2, and a third sensor structure 28-3 are integrated in a same plane at the top portion of the device layer 22, as shown in FIG. 5. In different applications, the device layer 22 may include fewer or more sensor structures in a linear layout or in an array layout.

Herein, the thinned flip-chip die 14 has an upper surface including a first surface portion SP1, a second surface portion SP2, a third surface portion SP3, and a fourth surface portion SP4. The second surface portion SP2 is surrounding the first surface portion SP1, the third surface portion SP3, and the fourth surface portion SP4. And the first surface portion SP1, the third surface portion SP3, and the fourth surface portion SP4 are separated from each other by the second surface portion SP2. A first sensor structure 28-1 is below the first surface portion SP1 and not below the second surface portion SP2. A second sensor structure 28-2 is below the third surface portion SP3 and not below the second surface portion SP2. A third sensor structure 28-3 is below the fourth surface portion SP4 and not below the second surface portion SP2. The first mold compound component 18 is formed directly over the second surface portion SP2 of the thinned flip-chip die 14 and not over the first surface portion SP1, the third surface portion SP3, or the fourth surface portion SP4 of the thinned flip-chip die 14. In different applications, the first sensor structure 28-1, the second sensor structure 28-2, and the third sensor structure 28-3 may be formed from a same sensor structure or different sensor structures.

Those skilled in the art will recognize improvements and modifications to the preferred embodiments of the present disclosure. All such improvements and modifications are considered within the scope of the concepts disclosed herein and the claims that follow.

What is claimed is:
1. An apparatus comprising:
a module substrate;
a thinned flip-chip die, which has an upper surface including a first surface portion and a second surface portion surrounding the first surface portion, comprising:
 a device layer including a first sensor structure integrated at a top portion of the device layer, wherein the first sensor structure is below the first surface portion and is not below the second surface portion;
 a dielectric layer over an upper surface of the device layer; and
 a plurality of interconnects extending from a lower surface of the device layer and coupled to the module substrate; and
a first mold compound component formed over the second surface portion to define a first cavity over the upper surface of the thinned flip-chip die, wherein the first mold compound component is not over the first surface portion, and the first surface portion is exposed at the bottom of the first cavity.

2. The apparatus of claim 1 further comprising a second mold compound component that resides over an upper surface of the module substrate and surrounds the thinned flip-chip die and the first mold compound component.

3. The apparatus of claim 2 further comprising an underfilling layer residing between the thinned flip-chip die and the upper surface of the module substrate.

4. The apparatus of claim 3 wherein the underfilling layer encapsulates the plurality of interconnects and further resides between the second mold compound component and the upper surface of the module substrate.

5. The apparatus of claim 3 wherein the underfilling layer is formed from a same material as the second mold compound component.

6. The apparatus of claim 3 wherein the underfilling layer is formed from a different material from the second mold compound component.

7. The apparatus of claim 2 wherein the first mold compound component and the second mold compound component are formed from a same material.

8. The apparatus of claim 2 wherein the first mold compound component and the second mold compound component are formed from different materials.

9. The apparatus of claim 1 further comprising a transparent material in the first cavity and residing over the first surface portion, wherein the first mold compound component is surrounding the transparent material.

10. The apparatus of claim 9 wherein the transparent material is formed from polymide.

11. The apparatus of claim 9 wherein the transparent material is configured to filter at least a portion of ambient light that passes through the transparent material.

12. The apparatus of claim 9 wherein the transparent material is configured to direct at least a portion of ambient light that passes through the transparent material toward a first area of the first surface portion.

13. The apparatus of claim 12 further comprising an integrated metal grating and the first sensor structure comprising at least one optical sensor below the first area of the first surface position, wherein the integrated metal grating is below the at least one optical sensor.

14. The apparatus of claim 1 wherein:
the upper surface of the thinned flip-chip die further includes a third surface portion surrounded by the second surface portion;
the device layer further comprises a second sensor structure integrated at the top portion of the device layer, wherein the second sensor structure is below the third surface portion and not below the second surface portion; and
the first mold compound component over the second surface portion forms a second cavity over the upper surface of the thinned flip-chip die, wherein the third surface portion is exposed at the bottom of the second cavity.

15. The apparatus of claim 14 wherein the first sensor structure is the same as the second sensor structure.

16. The apparatus of claim 14 wherein the first sensor structure is different from the second sensor structure.

17. The apparatus of claim 1 wherein the upper surface of the thinned flip-chip die is an upper surface of the dielectric layer.

18. The apparatus of claim 1 wherein the device layer further comprises a multi-layer metal structure.

19. The apparatus of claim 1 wherein the first sensor structure comprises a thermistor sensor or a bolometer sensor.

20. The apparatus of claim 1 wherein the first sensor structure comprises at least one optical sensor.

21. The apparatus of claim 20 wherein the at least one optical sensor is formed from at least one PIN diode.

22. The apparatus of claim 20 wherein the device layer further comprises an integrated metal grating below the at least one optical sensor, wherein the integrated metal grating is configured to reflect received light passing through the dielectric layer back toward the at least one optical sensor.

23. The apparatus of claim 22 wherein the integrated metal grating is formed from a metal layer within the device layer.

24. The apparatus of claim 22 wherein the integrated metal grating is on a first plane and the optical sensor is on a second plane, which is above and separated from the first plane by at least 2 μm.

25. The apparatus of claim 20 wherein the device layer further comprises an integrated metal grating on a first plane and the at least one optical sensor comprises a first sensor portion and a second sensor portion on a second plane, which is above the first plane, wherein the integrated metal grating is configured to separate and reflect colors for the first sensor portion and the second sensor portion.

26. The apparatus of claim 25 wherein the integrated metal grating is configured to separate and reflect received light passing through the dielectric layer back toward the first sensor portion and the second sensor portion such that light in a first spectrum of the received light is predominantly directed toward the first sensor portion and light in a second spectrum of the received light is predominantly directed toward the second sensor portion.

27. The apparatus of claim 1 wherein the first sensor structure comprises an optical sensor array.

28. The apparatus of claim 27 further comprising a transparent material in the first cavity and residing over the first surface portion, wherein the first mold compound component is surrounding the transparent material.

29. The apparatus of claim 28 wherein the transparent material is configured to filter at least a portion of ambient light that passes through the transparent material.

30. The apparatus of claim 28 wherein the transparent material is configured to direct at least a portion of ambient light that passes through the transparent material toward a first area of the first surface portion.

31. The apparatus of claim 1 wherein the first sensor structure comprises a first optical sensor and a second optical sensor, wherein;
  the first optical sensor and the second optical sensor are below the first surface portion; and
  the first optical sensor is laterally adjacent to the second optical sensor.

* * * * *